(12) United States Patent
Yoshida

(10) Patent No.: US 6,812,780 B2
(45) Date of Patent: Nov. 2, 2004

(54) FILTER CIRCUIT AND DETECTION CIRCUIT HAVING FILTER CIRCUIT

(75) Inventor: Akira Yoshida, Chiba (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/341,414

(22) Filed: Jan. 14, 2003

(65) Prior Publication Data

US 2003/0184366 A1 Oct. 2, 2003

Related U.S. Application Data

(60) Provisional application No. 60/348,372, filed on Jan. 16, 2002.

(51) Int. Cl.[7] .............................. H03B 1/10; H03K 5/00; H04B 1/10
(52) U.S. Cl. ........................................ 327/557; 327/552
(58) Field of Search ................................. 327/552–559

(56) References Cited

U.S. PATENT DOCUMENTS

| | | | |
|---|---|---|---|
| 5,764,100 A | * | 6/1998 | Callicotte et al. ............ 327/554 |
| 6,181,197 B1 | * | 1/2001 | Bret et al. .................... 327/557 |
| 6,194,959 B1 | * | 2/2001 | Kamoshida et al. ......... 327/552 |

FOREIGN PATENT DOCUMENTS

JP         2001339275 A  * 12/2001   .......... H03H/11/12

* cited by examiner

*Primary Examiner*—Quan Tra
(74) *Attorney, Agent, or Firm*—Volentine Francos Whitt PLLC

(57) ABSTRACT

A filter circuit has an input terminal which is input with a first current, and which is coupled with a first node, capacitor, of which one terminal is coupled with the first node, of which the other terminal is coupled with a second node, and which integrates the first current and outputs voltages a transconductance means, of which one terminal is coupled with the first node, of which another terminal is coupled with the second node, of which the other terminal is coupled with a third node, and which outputs a second current being proportional to the voltage to the third node and an output terminal which is coupled with the first node, and which outputs the voltage.

10 Claims, 5 Drawing Sheets

FILTER CIRCUIT AND DETECTION CIRCUIT HAVING FILTER CIRCUIT

This claims priority under 35 USC §119(e) (1) of Provisional Application No.60/348,372, filed on Jan. 16, 2002.

BACKGROUND OF THE INVENTION

1. Field of the Invention

The present invention relates, in general, to a fitter circuit and, more particularly, to a filter circuit having a transconductance amplifier and a detection circuit having the filter circuit.

2. Description of the Related Art

The conventional filter circuit is disclosed in "An Accurate Center Frequency Tuning Scheme for 450-khz CMOS Gm-C Bandpass Fiters", Hiroshi Yamazaki et al, IEEE Journal of Solid State Circuits, vol. 34, No. 12, Dec. 1999.

The conventional circuit having the conventional filter circuit will be described in FIG. 5. The conventional circuit comprises with a current outputting circuit 510, a current-voltage transferring circuit 520 connecting to the current outputting circuit 510 and a filter circuit 530 connecting to the current-voltage transferring circuit 520. The filter circuit 530 is a biquad bandpass filter. The filter circuit 530 has an input terminal 531, the transconductance amplifiers 532–535, the capacitors 536, 537 and an output terminal 538. Each transconductance amplifier has a voltage input terminal, a current input terminal and a current output terminal. The input terminal 531 is supplied with an input signal Vin of which type is voltage. The voltage input terminal of the transconductance amplifier 532 is connected to the input terminal 531. The current input terminal of the transconductance amplifier 532 is connected to a ground node which is supplied with the ground voltage. The current output terminal of the transconductance amplifier 532 is connected to the current input terminal of the transconductance amplifier 533, the current input terminal and the voltage input terminal of the transconductance amplifier 534, one terminal of the capacitor 535, the voltage input terminal of the transconductance amplifier 535 and the output terminal 538. The current output terminal of the transconductance amplifier 533 is connected to the ground node. The voltage input terminal of the transconductance amplifier 533 is connected to the current output terminal of the transconductance amplifier 535 and one terminal of the capacitor 537. The current output terminal of the transconductance amplifier 534, the other terminal of the capacitor 536, the current input terminal of the transconductance amplifier 535 and the other terminal of the capacitor 537 is connected to the ground node. The output terminal 538 outputs an output signal Vout.

Each transconductance value (the coefficient of voltage-current transfer of the transconductance amplifiers 532–535 is gm. The capacitors 536, 537 have a capacitance value of C1 and C2, respectively A transfer equation T(S) of the filter circuit 530 shown in FIG. 5 is:

$$T(s) = \frac{Vout}{Vin} = \frac{\frac{s}{gm \cdot C2}}{s^2 + \frac{s}{gm \cdot C2} + \frac{1}{gm^2 \cdot C1 \cdot C2}} \quad (1)$$

A transfer equation T(S) of a typical quadratic bandpass filter is:

$$T(s) = \frac{\frac{\omega_0}{Q}s}{s^2 + \frac{\omega_0}{Q}s + \omega_0^2} \quad (2)$$

In comparison between equations [1] and [2], the filter circuit 530 operates as the bandpass filter in this example, the cutoff frequency ω0 and quality factor Q are:

$$\omega_0 = \frac{1}{gm \cdot \sqrt{C1 \cdot C2}} \quad (3)$$

$$Q = \sqrt{\frac{C2}{C1}} \quad (4)$$

The filter circuit 530 covers scattering value of the element by adjusting the transconductance value of the transconductance amplifier, so the filter circuit 530 achieves high precision of the filter characteristics However, the conventional circuit having the conventional filter circuit has the current-voltage transferring circuit between the current outputting circuit and the filter circuit. The input terminal Vin of the filter circuit 530 does not input current but voltage. Therefore, the circuit scale of the conventional circuit having the filter circuit becomes large and the conventional circuit requires a measurable amount of power.

In addition, the transconductances, differing from the passive element such as inductor or resistor et al., have to use within the range that the amplitude of the input signal Vin does not exceed the input dynamic range. The filter circuit has to control the amplitude of the input signal Vin. The input signal Vin includes the main signal component and the frequency component of the passing band which is the same as the main signal component Therefore, the efficiency of the filter circuit is inefficient.

SUMMARY OF THE INVENTION

According to one aspect of the present invention, there is provided a filter circuit having an input terminal which is input with a first current and which is coupled with a first nodes, a capacitor of which one terminal is coupled with the first node, of which the other terminal is coupled with a second node and which integrates the first current and outputs voltage, a transconductance means of which one terminal is coupled with the first node, of which another terminal is coupled with the second nodes of which the other terminal is coupled with a third node and which outputs a second current being proportional to the voltage to the third node and an output terminal which is coupled with the first node and which outputs the voltage.

DETAILED DESCRIPTION OF THE PREFERRED EMBODIMENTS

A filter circuit according to the preferred embodiments of the present invention will be described. Moreover, not all the combinations of the characteristics of the present invention described in the embodiments are essential to the present invention.

A filter circuit according to a first preferred embodiment of the present invention will be described with reference to FIGS. 1–2.

First, the composition of the fitter circuit according to the first preferred embodiment of the present invention will be described. FIG. 1 is a circuit block diagram showing a circuit having a filter circuit according to the first preferred embodiment of the present invention.

Figure 1:
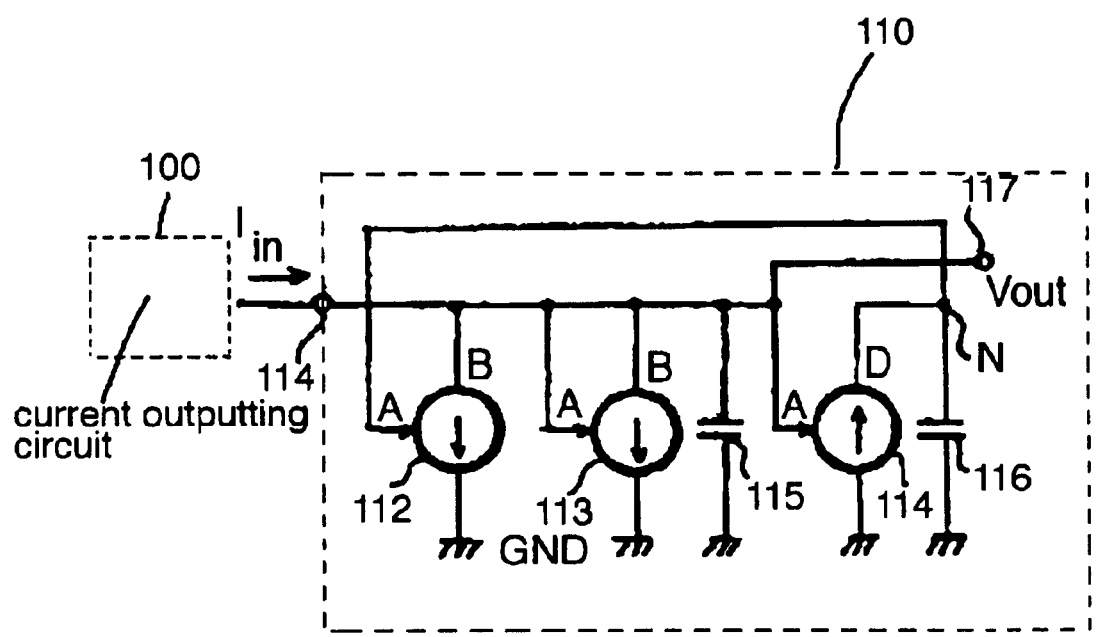
FIG. 1 is a circuit block diagram showing a circuit having a filter circuit according to a first preferred embodiment of the present invention.
Figure 2:
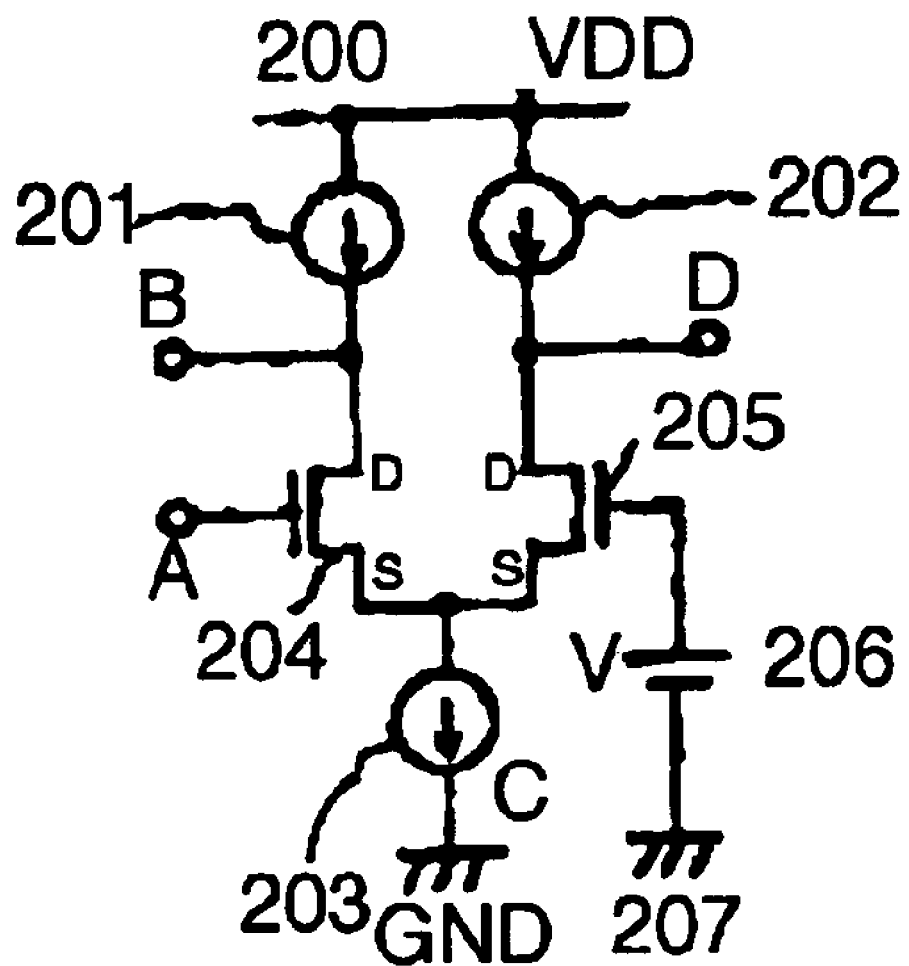
FIG. 2 is a circuit block diagram showing a transconductance amplifier according to the first preferred embodiment of the present invention.

As shown in FIG. 1, the circuit has a current outputting circuit 100 and a filter circuit 110 electrically coupling to the current outputting circuit 100.

The current outputting circuit 100 outputs current Iin to the filter circuit 110.

The filter circuit 110 is a quadratic biquad bandpass filter. The fitter circuit 110 has an input terminal 111, transconductance amplifiers 112–114, capacitors 115–116, node N and an output terminal 117. Each transconductance amplifier has at least three terminals A–B and C or D. The input terminal 111 is coupled to the terminal B of the transconductance amplifier 112, the terminals A–B of the tansconductance amplifier 113, the terminal A of the transconductance amplifier 114, one terminal of the capacitor 115 and the output terminal 117. The terminal A of the transconductance amplifier 112 is coupled to the node N. The terminals C of the transconductance amplifiers 112–114 are coupled to the ground node GND, respectively. The terminal D of the transconductance amplifier 114 is coupled to the node N. The other terminal of the capacitor 115 is coupled to the ground node GND. One of the characteristics of the filter circuit according to the first preferred embodiment of the present invention is that the capacitor 115 is connected to the input terminal 111 and the ground node GND. Therefore, the capacitor 115 integrates an input signal of which type is current and outputs a signal of which type is voltage. One terminal of the capacitor 116 is coupled to the node N and the other thereof is coupled to the ground node GND.

Next, the composition of the transconductance amplifier circuit according to the first preferred embodiment of the present invention will be described. FIG. 2 is a circuit block diagram showing a transconductance amplifier according to the first preferred embodiment of the present invention.

The transconductance amplifier has current sources 201–203, N-channel MOS transistors (NMOS transistors) 204–205 and a voltage supplying circuit 206. Each NMOS transistor has a drain electrode (first electrode), a source electrode (second electrode) and a gate electrode (control electrode). One terminal of the current source 201 is coupled to the VDD voltage supply 200 and the other terminal thereof is coupled to the terminal B. One terminal of the current source 202 is coupled to the VDD voltage supply 200 and the other terminal thereof is coupled to the terminal D. One terminal of the current source 203 is coupled to the source electrodes of the NMOS transistors 204, 205 and the other terminal thereof is coupled to the ground node GND. The drain electrode of the NMOS transistor 204 is coupled to the terminal B, the source electrode thereof is coupled to one terminal of the current source 203 and me gate electrode thereof is coupled to the terminal A. The drain electrode of the NMOS transistor 205 is coupled to the terminal D, the source electrode thereof is coupled to one terminal of the current source 203 and the gate electrode thereof is coupled to one terminal of the voltage supplying circuit 206. The gate electrode of the NMOS transistor 205 is supplied with constant voltage Vc. The other terminal of the voltage supplying circuit 206 is coupled to the ground node GND.

Each transconductance amplifier inputs or outputs current which is proportional to input voltage at the terminal A through the terminals B and D. The proportion coefficient (dividing output current by input current) is the transconductance value gm.

The operation of the filter circuit according to the first preferred embodiment of the present invention will be described with the transfer equation.

Current value of an input signal which is input to the input terminal 111 is current Iin. Voltage of an output signal which is output from the node N is Va. The voltage of the output terminal 117 is Vout. The capacitor 116 has a capacitance value of C1. The capacitor 116 has a capacitance value of C2. A simultaneous equation is:

$$Iin = Vout*gm + Vout/s*C1 + Va*gm$$

$$Vout*gm = Va/s*C2$$

Therefore, a transfer equation Z(s) is:

$$Z(s) = \frac{Vout}{Iin} = \frac{\frac{s}{gm^2 \cdot C2}}{s^2 + \frac{s}{gm \cdot C2} + \frac{1}{gm^2 \cdot C1 \cdot C2}} \tag{5}$$

By comparison between the transfer equation [1] of the conventional filter circuit and the transfer equation [5] of the filter circuit according to the first preferred embodiment of the present invention, the equation is given as:

$$Z(s) = T(s)/gm$$

The transconductance value gm is fixed value and does not depend on the frequency. Therefore, the gain of the transfer equation Z(s) is 1/gm against thereof the transfer equation T(s). Thus, the cutoff characteristic of the filter circuit according to the first preferred embodiment of the present invention is equal to thereof the conventional filter circuit.

The filter circuit according to the first preferred embodiment of the present invention inputs the signal of which type is current, and directly supplies the current with the capacitor. The filter circuit according to the first preferred embodiment of the present invention needs not to have the current-voltage transferring circuit. Therefore, the filter circuit according to the first preferred embodiment of the present invention reduces the circuit scale and electric power consumption.

A filter circuit according to a second preferred embodiment of the present invention will be described with reference to FIG. 3.

First, the composition of the filter circuit according to the second preferred embodiment of the present invention will be described. FIG. 3 is a circuit block diagram showing a circuit having a filter circuit according to the second preferred embodiment of the present invention. Like elements are given like or corresponding reference numerals in the first and second preferred embodiments. Thus, dual explanations of the same elements are avoided.

Figure 3:
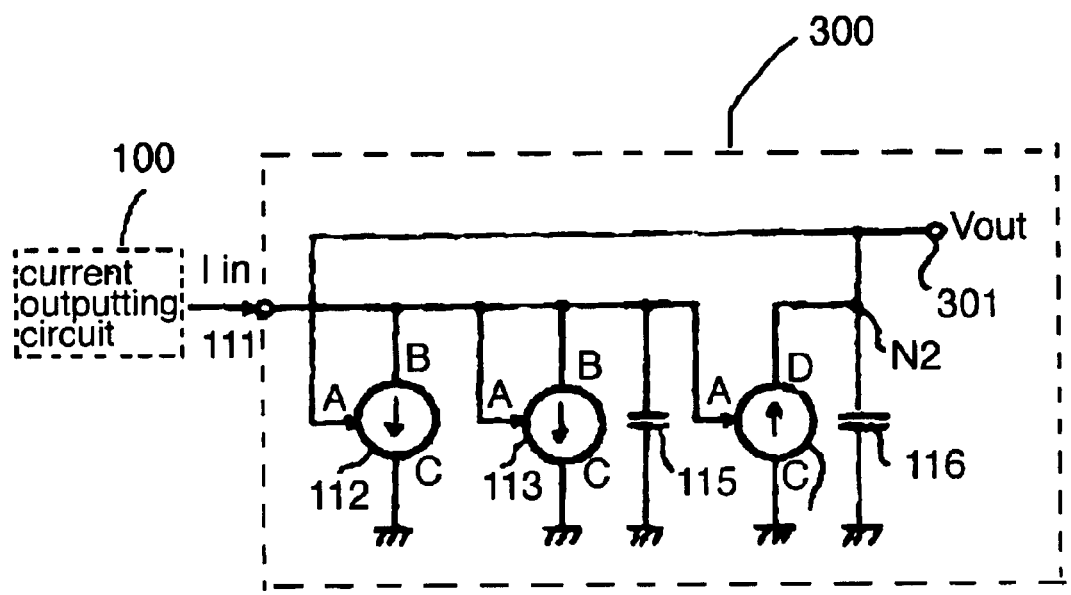
FIG. 3 is a circuit block diagram showing a circuit having a filter circuit according to a second preferred embodiment of the print invention.

As shown in FIG. 3, the circuit has the current outputting circuit 100 and a filter circuit 300 electrically coupling to the current outputting circuit 100. The filter circuit 300 is a quadratic biquad bandpass filter. The filter circuit 300 has an input terminal 111, transconductance amplifiers 112–114, capacitors 115–116, node N2 and an output terminal 301.

A difference the filter circuit 110 according to the first preferred embodiment and the filter circuit 300 according to the second preferred embodiment is the connection relationship with the output terminal 301. The node N2 is coupled to the terminal A of the transconductance amplifier 112, the terminal D of the transconductance amplifier 114, one terminal of the capacitor 116 and the output terminal 301. The output terminal 301 and the one terminal of the capacitor 115 are not directly connected to each other.

By the way, one of the characteristics of the filter circuit according to the second preferred embodiment of the present invention is that the capacitor 115 is connected to the input terminal 111 and the ground node GND. Therefore, the capacitor 115 integrates an input signal of which type is current and outputs a signal of which type is voltage.

The operation of the filter circuit according to the second preferred embodiment of the present invention will be described with the transfer equation. The transfer equation Z(s) is:

The above transfer equation is the same as the equation of the low pass filter circuit. Therefore, the filter circuit according to the second preferred embodiment of the present invention operates as the low pass filter of the current input type.

As the filter circuit according to the first preferred embodiment of the present invention, the filter circuit according to the second preferred embodiment of the present invention inputs the signal of which type is current and directly supplies the current with the capacitor. The filter circuit according to the second preferred embodiment of the present invention needs not to have the current-voltage transferring circuit. Therefore, the filter circuit according to the second preferred embodiment of the present invention reduces the circuit scale and electric power consumption.

In addition, the transfer equation of the filter circuit according to the second preferred embodiment of the present invention is the same as the transfer equation of the low-pass filter circuit. Therefore, the filter circuit according to the second preferred embodiment of the present invention operates as the low-pass filter circuit.

A detection circuit having a filter circuit according to a third preferred embodiment of the present invention will be described with reference to FIG. 4.

First, the composition of the detection circuit having the filter circuit according to the third preferred embodiment of the present invention will be described. FIG. 4 is a circuit block diagram showing the detection circuit having the filter circuit according to the third preferred embodiment of the present invention. Like elements are given like or corresponding reference numerals in the above preferred embodiments. Thus, dual explanations of the same elements are avoided.

Figure 4:
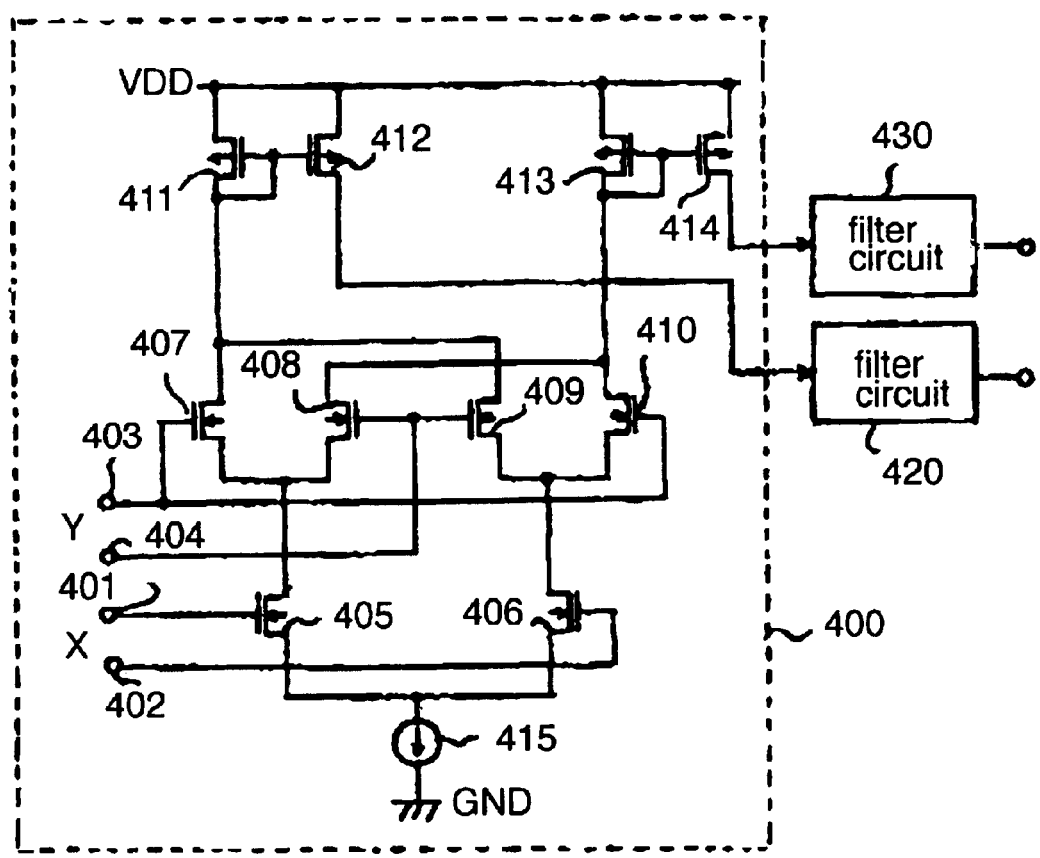
FIG. 4 is a circuit block diagram showing a detection circuit having a filter circuit according to a third preferred embodiment of the present invention.
Figure 5:
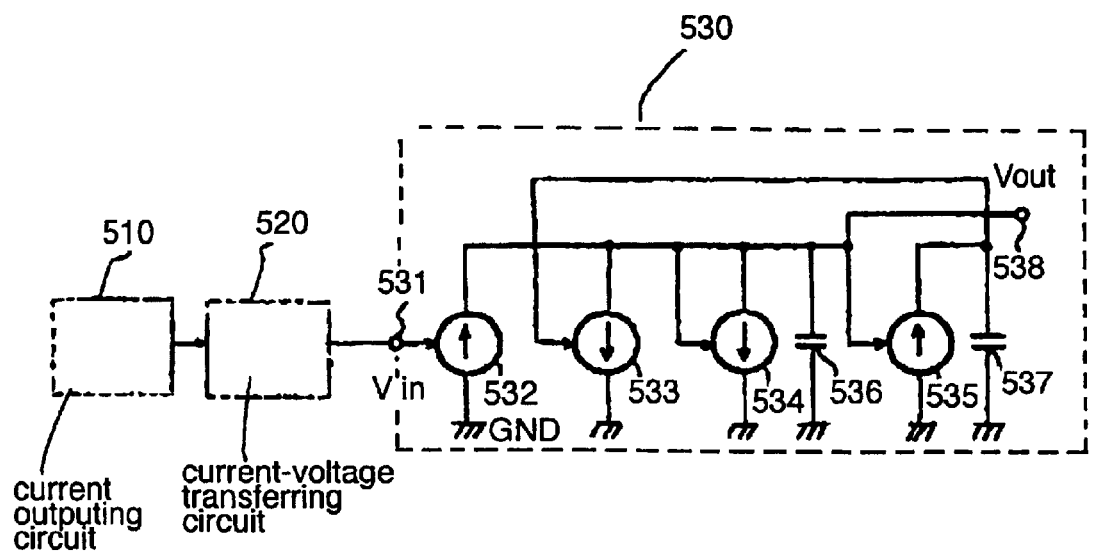
FIG. 5 is a circuit block diagram showing a conventional circuit having a conventional filter circuit.

As shown in FIG. 4, the detection circuit has a double balanced mixer 400 and filter circuits 420 and 430. The filter circuits 420 and 430 are the same as the filter circuits according to the first preferred embodiment of the present invention.

The double balanced mixer 400 has input terminals 401–404, N-channel MOS transistors (NMOS transistors) 405–410, P-channel MOS transistors (PMOS transistors) 411–414 and a current source 415. Each NMOS transistor has a source electrode (a fist or a second electrode), a drain electrode (the second or the first electrode) and a gate electrode (a control electrode). Correspondingly, each PMOS transistor has a source electrode (a first or a second electrode), a drain electrode (the second or the first electrode) and a gate electrode (a control electrode).

The input terminals 401 and 402 are input with a balance input signal X, respectively. The input terminals 403 and 404 are input with a balance input signal Y, respectively. The input terminal 401 is coupled to a gate electrode of NMOS transistor 405. The input terminal 402 is coupled to a gate electrode of NMOS transistor 406. Source electrodes of NMOS transistors 405 and 406 are coupled to one terminal of the current source 415. The other terminal of the current source 415 is coupled to a ground node GND which is supplied with ground voltage. A drain electrode of NMOS transistor 405 is coupled to source electrodes of NMOS transistors 407 and 408. A drain electrode of NMOS transistor 406 is coupled to source electrodes of NMOS transistors 409 and 410. The input terminal 403 is coupled to gate electrodes of NMOS transistors 407 and 410. The input terminal 404 is coupled to gate electrodes of NMOS transistors 408 and 409. A drain electrode of NMOS transistor 407 is coupled to a drain electrode of NMOS transistor 409, a drain and gate electrodes of PMOS transistor 411 and a gee electrode of PMOS transistor 412. Source electrodes of PMOS transistors 411 and 412 are coupled to a supply voltage node VDD which is supplied with supply voltage. A drain electrode of PMOS transistor 412 is coupled to the filter circuit 420. PMOS transistors 411 and 412 are composed of a current mirror circuit. A drain electrode of NMOS transistor 408 is coupled to a drain electrode of NMOS transistor 410, a drain and gate electrodes of PMOS transistor 413 and a gate electrode of PMOS transistor 414. The source electrodes of PMOS transistors 413 and 414 are coupled to the supply voltage node VDD. A drain electrode of PMOS transistor 414 is coupled to the filter circuit 430. PMOS transistors 413 and 414 are composed of a current mirror circuit.

The operation of the detection circuit according to the third preferred embodiment of the present invention will be described with the transfer equation.

The double balanced mixer 400 is typical circuit operating as a multiplexer. The frequency of the balance input signal X is f1. The frequency of the balance input signal Y is f2 (f1>f2). The main frequency components of current which is output by PMOS transistor 412 is f1+f2. The main frequency Components of current which is output by PMOS transistor 414 is f1−f2. According to characteristics of the double balanced mixer 400, output levels of both frequency components are same each other. The output current of the main frequency components is Icomp which is supplied to the filter circuits 420 and 430. The peak value of the output current is 2*Icomp.

By the way, an input dynamic range of the filter circuit 420 is described next. The input terminal and output terminal of the filter circuit 420 are connected to each other, as shown in FIG. 1. When the input dynamic range of the filter circuit 420 is Vdyn, the peak current value of the input current Iin should be required the followings equations.

$$Vdyn \geq Vout = Z(s)*Iin$$

$$2*Icomp \leq Vdyn/Z(s) \qquad [7]$$

As mentioned above, the peak value 2*Icomp is the sum of the output current of f1+f2 and the output current of f1−f2. Therefore, the double balanced mixer 400 outputs only when the peak current Icomp of each frequency component meets equation [7]. When the frequency of the pass band of the filter circuit 420 is f1–f2, the unnecessary frequency components f1+f2 which is output by the double balanced mixer 400 is cut off at the point of being input it into the filter circuit 420. Because the input and output terminals are connected with each other. Therefore, the frequency components which is input into the filter circuit 420 is the desired value f1–f2 and its peak current value is Icomp. The equation [8] showing input dynamic range of the transconductance amplifier in the filter circuit 420 is:

$$Icomp \leq Vdyn/Z(s) \qquad [8]$$

As compared with the equation [7], the equation [8] shows that the output level of the double balanced mixer 400 is allowed up to two times. Because the unnecessary frequency components are cut off at an input phase of the filter circuit.

The detection circuit having a filter circuit according to the third preferred embodiment of the present invention cuts off the unnecessary frequency components at an input phase of the filter circuit. Therefore, the detection circuit having a filter circuit according to the third preferred embodiment of the present invention causes the output level of the double balanced mixer to be large.

While the preferred form of the present invention has been described, it is to be understood that modifications will be apparent to those skilled in the art without departing from the spirit of the invention.

For example, the filter circuit shown in the first preferred embodiment is an equation biquad bandpass filter. However, the 2*n-degree biquad bandpass filter is used instead of the equation biquad bandpass filter according to connecting the equation biquad bandpass to the number of n in series. For example, the filter circuit shown in the second preferred embodiment is an equation biquad lowpass filter. However, the 2*n-degree biquad lowpass filter is used instead of the equation biquad lowpass filter according to connecting the equation biquad lowpass to the number of n in series. For example, the filter circuits according to the first and second preferred embodiments of the present invention use the biquad filter. The filter circuits are not limited to the biquad liters. The filter circuit having the transconductance amplifier is used. For example, two filter circuits are used in the detection circuit according the fourth preferred embodiment of the present invention. The number of the filter circuits is not limited to two. For example, the detection circuit according to the third preferred embodiment of the present invention uses the bandpess filter circuit shown in FIG. 1. However, the lowpass filter circuit shown in FIG. 3 may be used.

The scope of the invention, therefore, is to be determined solely by the following claims.

What is claimed:

1. A filter circuit comprising:
    an input terminal which is input with a first current, and which is coupled with a first node;
    a capacitor, of which one terminal is coupled with the first node, of which the other terminal is coupled with a second node, and which integrates the first current and outputs a voltage;
    a transconductance means, of which one terminal is coupled with the first node, of which another terminal is coupled with the second node, of which the other terminal is coupled with a third node, and which outputs a second current being proportional to the voltage to the third node, wherein the transconductance means comprises
        a first current source which is supplied with a supply voltage and which is coupled with the first node,
        a second current source which is supplied with the supply voltage and which is coupled with the third node,
        a third current source which is coupled with the second node;
        a first transistor which has a control electrode coupled with the third node, a first electrode coupled with the first current source and a second electrode coupled with the third current source, and
        a second transistor which has a control electrode coupled with a voltage supply circuit, a first electrode coupled with the second current source and a second electrode coupled with the third current source,
        the voltage supply circuit supplying a control voltage for the control electrode of the second transistor and being coupled with the second node, an output terminal which is coupled with the first node, and which outputs the voltage.

2. The filter circuit according to claim 1, wherein said second node is supplied with a ground voltage.

3. The filter circuit according to claim 2, wherein said capacitor is a first capacitor, and wherein said voltage is a first voltage, and wherein said filter circuit further comprises:
    a second capacitor, of which one terminal is coupled with the third node, of which the other terminal is coupled with the second node, and which in grates the second current and outputs a second voltage.

4. The filter circuit according to claim 3, wherein said transconductance means is a first transconductance means, and said flit circuit further comprises:
    a second transconductance means, of which one terminal is coup ed with the first node, of which another terminal is coupled with the second node, of which the other terminal is coupled with the third node.

5. The filter circuit according to claim 4, wherein said second transconductance means comprises:
    a first current source which is supplied with the supply voltage, and which is coupled with the first node;
    a second current source which is supplied with the supply voltage;
    a third current source which is coupled with the second node;
    a first transistor which has a control electrode coupled with the third node, a first electrode coupled with the first node and a second electrode coupled with the third current source;
    a second transistor which has a control electrode coupled with a voltage supply circuit, a first electrode coupled with the second current source and a second electrode coupled with the third current source; and
    the voltage supply circuit which supplies a control voltage for the control node of the second transistor, and which is coupled with the second node.

6. The filter circuit according to claim 4, further comprising:
    a third transconductance means, of which two terminals are electrically coupled with the first node, of which the other terminal is electrically coupled with the second node.

7. The filter circuit according to claim 6, wherein said third transconductance means comprises:

a first current source which is supplied with the supply voltage, and which is coupled with the first node;

a second current source which is supplied with the supply voltage;

a third current source which is coupled with the second node;

a first transistor which has a control electrode coupled with the first node, a first electrode coupled with the first node and a second electrode coupled with the third current source;

a second transistor which has a control electrode coupled with a voltage supply circuit, a first electrode coupled with the second current source and a second electrode coupled with the third current source; and the voltage circuit which supplies a control voltage for the control node of the second transistor, and which is coupled with the second node.

8. A filter circuit comprising:

an input terminal which is input with a first current, and which is coupled with a first node;

a first capacitor, of which one terminal is coupled with the first node, of which another terminal is coupled with a second node, and which integrates the first current and outputs a first voltage;

a transconductance means, of which one terminal is coupled with the first node, of which another terminal is coupled with the second node, of which a further terminal is coupled with a third node, and which outputs a second current being proportional to the first voltage to the third node;

a second capacitor, of which one terminal is coupled with the third node of which another terminal is coupled with the second node and which integrates the second current and outputs a second voltage; and an output terminal which is coupled with the third node, and which outputs the second voltage, wherein said second node is supplied with a ground voltage, wherein the transconductance means comprises a first current source which is supplied with a supply voltage;

a second current source which is supplied with the supply voltage, and which is coupled with the third node;

a third current source which is coupled with the second node;

a first transistor which has a control electrode coupled with the first node, a first electrode coupled with the first current source and a second electrode coupled with the third current source;

a second transistor which has a control electrode coupled with a voltage supply circuit, a first electrode coupled with the third node and a second electrode coupled with the third current source; and the voltage supply circuit which supplies a control voltage for the control node of the second transistor, and which is coupled with the second node.

9. A filter circuit comprising:

an input terminal which is input with a first current, and which is coupled with a first node;

a first capacitor, of which one terminal is coupled with the first node, of which another terminal is coupled with a second node, and which integrates the first current and outputs a first voltage;

a transconductance means, of which one terminal is coupled with the first node, of which another terminal is coupled with the second node, of which a her terminal is coupled with a third node, and which outputs a second current being proportional to the first voltage to the third node;

a second capacitor, of which one terminal is coupled with the third node of which another terminal is coupled with the second node and which integrates the second current and outputs a second voltage; and an output terminal which is coupled with the third node, and which outputs the second voltage, wherein said second node is supplied with a ground voltage, wherein said transconductance means is a first transconductance means, and said filter circuit further comprises a second transconductance means, of which one terminal is coup ed with the first node, of which another terminal is coupled with the second node, and of which a further terminal is coupled with the third node, wherein said second transconductance means comprises a first current source which is supplied with the supply voltage, and which is coupled with the first node;

a second current source which is supplied with the supply voltage;

a third current source which is coupled with the second node;

a first transistor which has a control electrode coupled with the third node, a first electrode coupled with the first node and a second electro coupled with the third current source;

a second transistor which has a control electrode coupled with a voltage supply circuit, a first electrode coupled with the second current source and a second electrode coupled with the third current source; and the voltage supply circuit which supplies a control voltage for the control node of the second transistor, and which is coupled with the second node.

10. A filter circuit comprising:

an input terminal which is input with a first current, and which is coupled with a first node;

a first capacitor, of which one terminal is coupled with the first node, of which another terminal is coupled with a second node, and which integrates the first current and outputs a first voltage;

a transconductance means, of which one terminal is coupled with the first node, of which another terminal is coupled with the second node, of which a further terminal is coupled with a third node, and which outputs a second current being proportional to the first voltage to the third node;

a second capacitor, of which one terminal is coupled with the third node, of which another terminal is coupled with the second node, and which integrates the second current and outputs a second voltage; and an output terminal which is coupled with the third node, and which outputs the second voltage, wherein said second node is supplied with a ground voltage, wherein said transconductance means is a first transconductance means, and said filter circuit further comprises a second transconductance means, of which one terminal is coupled with the first node, of which another terminal is coupled with the second node, and of which a further terminal is coupled with the third node; and a third transconductance means, of which two terminals are electrically coupled with the first node, and of which another terminal is electrically coupled with the second node, wherein said third transconductance means comprises
- a first current source which is supplied with the supply voltage, and which is coupled with the first node;
- a second current source which is supplied with the supply voltage;
- a third current source which is coupled with the second node;
- a first transistor which has a control electrode coupled with the first node, a first electrode coupled with the first node and a second electrode coupled with the third current source;
- a second transistor which has a control electrode coupled with a voltage supply circuit, a first electrode coupled with the second current source and a second electrode coupled with the third current source, and
- the voltage supply circuit which supplies a control voltage for the control node of the second transistor, and which is coupled with the second node.

* * * * *